(12) United States Patent
Hirano (10) Patent No.: US 8,416,382 B2
(45) Date of Patent: Apr. 9, 2013

(54) PROCESSING APPARATUS AND DEVICE MANUFACTURING METHOD

(75) Inventor: Shinichi Hirano, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 631 days.

(21) Appl. No.: 12/025,940

(22) Filed: Feb. 5, 2008

(65) Prior Publication Data

US 2008/0186464 A1   Aug. 7, 2008

(30) Foreign Application Priority Data

Feb. 7, 2007   (JP) .................................. 2007-027469

(51) Int. Cl.
*G03B 27/52* (2006.01)
*G03B 27/32* (2006.01)
*G06F 7/00* (2006.01)

(52) U.S. Cl.
USPC .............................. 355/27; 700/228; 355/77

(58) Field of Classification Search .................. 396/611; 355/53, 27, 77; 438/908; 700/213, 218, 700/228; 198/341.01
See application file for complete search history.

(56) References Cited

U.S. PATENT DOCUMENTS

| 6,287,023 B1 * | 9/2001 | Yaegashi et al. ............... 396/565 |
| 6,583,857 B2 * | 6/2003 | Hagiwara ........................ 355/69 |
| 6,585,430 B2 * | 7/2003 | Matsuyama et al. .......... 396/611 |
| 6,698,944 B2 | 3/2004 | Fujita |
| 2001/0053291 A1 | 12/2001 | Fujita |
| 2002/0006675 A1 * | 1/2002 | Shigaraki .......................... 438/4 |
| 2005/0279281 A1 * | 12/2005 | Yamashita et al. ............ 118/719 |
| 2006/0061747 A1 * | 3/2006 | Ishii ................................ 355/53 |
| 2007/0183774 A1 * | 8/2007 | Tajiri et al. .................... 396/611 |

FOREIGN PATENT DOCUMENTS

| JP | 03-163818 A | 7/1991 |
| JP | 2000-185820 A | 7/2000 |
| JP | 2000-323550 A | 11/2000 |
| JP | 2001-126976 A | 5/2001 |
| JP | 2001-127132 A | 5/2001 |
| JP | 20027075853 A | 3/2002 |
| JP | 2003-224175 A | 8/2003 |
| JP | 2006-012912 A | 1/2006 |

OTHER PUBLICATIONS

Machine translation of JP 2000-185820 published Jul. 4, 2000.*

* cited by examiner

*Primary Examiner* — Steven H Whitesell Gordon
(74) *Attorney, Agent, or Firm* — Canon USA, Inc., IP Division (57) ABSTRACT

A processing apparatus including a processing unit configured to process an object includes a conveying unit configured to convey an object between a transfer portion provided between an external apparatus and the processing unit, and the processing unit, a controller configured to output a request signal requesting the external apparatus to convey the object to the transfer portion, and an output unit configured to output a signal indicating a start of maintenance of the processing apparatus. The controller is configured to output to the external apparatus a signal for stopping the conveyance of the object to the transfer portion, based on the signal indicating the start of maintenance output from the output unit, after outputting the request signal.

10 Claims, 6 Drawing Sheets

PROCESSING APPARATUS AND DEVICE MANUFACTURING METHOD

BACKGROUND OF THE INVENTION

1. Field of the Invention

The present invention relates to a processing apparatus configured to process an object such as a device manufacturing apparatus, for example, an exposure apparatus configured to expose a substrate to radiant energy such as light.

2. Description of the Related Art

As discussed in Japanese Patent Application Laid-Open No. 2000-75853, in a semiconductor exposure processing, an exposure apparatus automatically receives a wafer coated with a photosensitive material from a coating and developing apparatus conveyed by a wafer conveyance robot provided in the coating and developing apparatus. Then, the wafer is exposed by the exposure apparatus to light. Then, the exposure-completed wafer is automatically transferred to the coating and developing apparatus conveyed by a wafer conveyance robot in the exposure apparatus.

The semiconductor exposure process proceeds without problem when the wafer conveyance processing, the photosensitive material coat processing, the exposure processing, and the exposed wafer development processing proceed smoothly. However, when a problem occurs and continuous processing has to be stopped for maintenance, an operator, for example, has to manually recover the wafer.

In a case of a stand-alone apparatus, an exposure apparatus or a coating and developing apparatus includes a mechanism which stops an operation of a conveyance robot in the apparatus when a maintenance door of the apparatus is opened for maintenance. However, for example, even if a drive of a conveying unit of the exposure apparatus is stopped before maintenance work is performed on the conveying unit of the exposure apparatus, if a drive of a conveying unit of the coating and developing apparatus is not stopped, the operator may not be able to perform maintenance on the exposure apparatus, and further, a problem may occur in the use of the exposure apparatus or the coating and developing apparatus.

SUMMARY OF THE INVENTION

The present invention is directed to increasing safety of a processing apparatus.

According to an aspect of the present invention, a processing apparatus including a processing unit configured to process an object includes a conveying unit configured to convey the object between a transfer portion provided between an external apparatus and the processing unit, and the processing unit, a controller configured to output a request signal requesting the external apparatus to convey the object to the transfer portion, and an output unit configured to output a signal indicating a start of maintenance of the processing apparatus. The controller is configured to output to the external apparatus a signal for stopping the conveyance of the object to the transfer portion, based on the signal indicating the start of the maintenance output from the output unit, after outputting the request signal.

According to another aspect of the present invention, a processing apparatus including a processing unit configured to process an object includes a conveying unit configured to convey the object between a transfer portion provided between an external apparatus and the processing unit, and the processing unit, a controller configured to output a request signal requesting the external apparatus to convey the object to the transfer portion, and an output unit configured to output a signal indicating a start of maintenance of the processing apparatus, a shutter configured to isolate an approach area of the conveying unit of the external apparatus that conveys the object in the transfer portion. The controller controls and closes the shutter based on the signal indicating the start of the maintenance output from the output unit, after outputting the request signal.

According to yet another aspect of the present invention, a device manufacturing method uses one of the processing apparatuses.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DETAILED DESCRIPTION OF THE EMBODIMENTS

Various exemplary embodiments, features, and aspects of the invention will be described in detail below with reference to the drawings.

When maintenance work is performed in a first processing apparatus according to an exemplary embodiment of the present invention, a signal indicating a start of the maintenance is output. Based on this signal, a controller outputs a signal to an external apparatus, according to which a conveyance of an object to a transfer portion is stopped.

According to an exemplary embodiment of the present invention, the processing apparatus and the external apparatus are device manufacturing apparatuses such as an exposure apparatus and a photosensitive material coating and developing apparatus. For example, if the external apparatus is the photosensitive material coating and developing apparatus, then the processing apparatus will be the exposure apparatus. If the external apparatus is the exposure apparatus, then the processing apparatus will be the photosensitive material coating and developing apparatus. The object to be processed is the wafer (substrate) and the request signal used for requesting the transfer portion to convey the object is referred to as a wafer input request. The processing unit used for processing the object is, for example, an alignment unit, an exposure unit, a photosensitive material coating unit or a photosensitive material developing unit. Furthermore, a first conveying unit configured to convey the object between the transfer portion, which is provided between the external apparatus and the processing unit, and the processing unit is, for example, a member conveyance robot. The maintenance refers to, for example, a maintenance operation on the first conveying unit.

The first processing apparatus according to an exemplary embodiment of the present invention includes a door used for maintenance and the output unit includes a detection unit configured to detect whether the door is open. A detection signal, which is output from the detection unit when the door is open, serves also as a signal according to which the maintenance is started. Further, the controller, for example, outputs a signal used for turning off a drive power of a conveying unit (i.e., a second conveying unit) in the external apparatus to stop the conveyance of the object. Alternatively, for example, the controller outputs a signal used to stop the conveyance of the object to either a power supply unit of the external apparatus which supplies power to the second conveying unit, or a controller of the external apparatus.

The electric signal can be transferred through a serial communication line which is provided to exchange apparatus information with the external apparatus or a dedicated computer for an overall control of the external apparatus. Further, the electric signal can be transferred through a signal cable which is provided exclusively for exchanging member transfer information between the processing apparatus and the external apparatus. In this case, the electric signal can also be transferred without the control computer of the external apparatus.

The second processing apparatus according to an exemplary embodiment of the present invention includes a shutter. The shutter is configured to isolate an approach area of the conveying unit of the external apparatus in the transfer portion. When maintenance is to be performed on the second processing apparatus, the controller controls and closes the shutter based on a signal indicating a start of the maintenance.

The second processing apparatus according to an exemplary embodiment of the present invention includes a door used for maintenance. The output unit includes a detection unit configured to detect whether the door is open. A detection signal, which is output from the detection unit when the door is open, also serves as a signal according to which maintenance is started.

First Exemplary Embodiment

Figure 1:
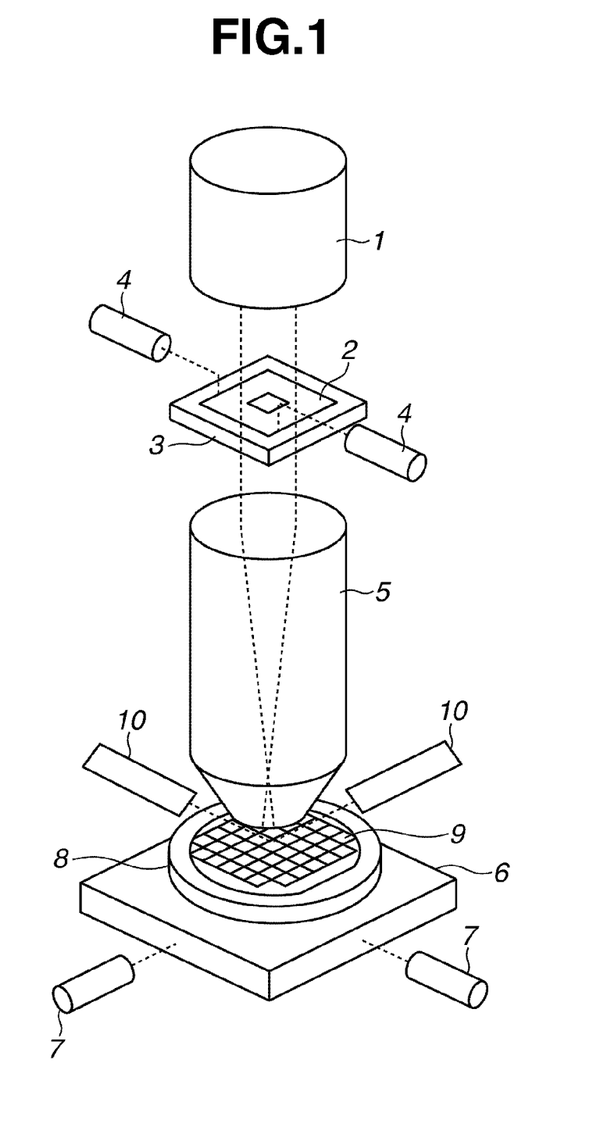
FIG. 1 illustrates a configuration of a semiconductor exposure apparatus according to an exemplary embodiment of the present invention.

FIG. 1 illustrates a configuration of a semiconductor exposure apparatus according to an exemplary embodiment of the present invention. The semiconductor exposure apparatus includes an illumination apparatus 1 having a light source and a shutter, a reticle stage 3 configured to mount a reticle 2 having a circuit pattern, and a reticle position measurement mechanism 4 configured to measure a position of the reticle 2 on the reticle stage 3. Further, the semiconductor exposure apparatus includes a projection lens 5 as a projection optical system used for printing, an XY stage 6 configured to move a wafer 9 (i.e., an object to be printed) in two directions i.e., the X and Y directions on the XY plane on which the wafer 9 is mounted, and a laser interferometer 7 configured to measure a position of the XY stage 6. Furthermore, the semiconductor exposure apparatus includes a wafer Z stage 8 configured to move thereon the wafer 9 in the vertical direction to adjust a focus during exposure (hereinafter referred to as focusing), and an auto focus unit 10 configured to measure a focus position of the wafer 9.

Figure 2:
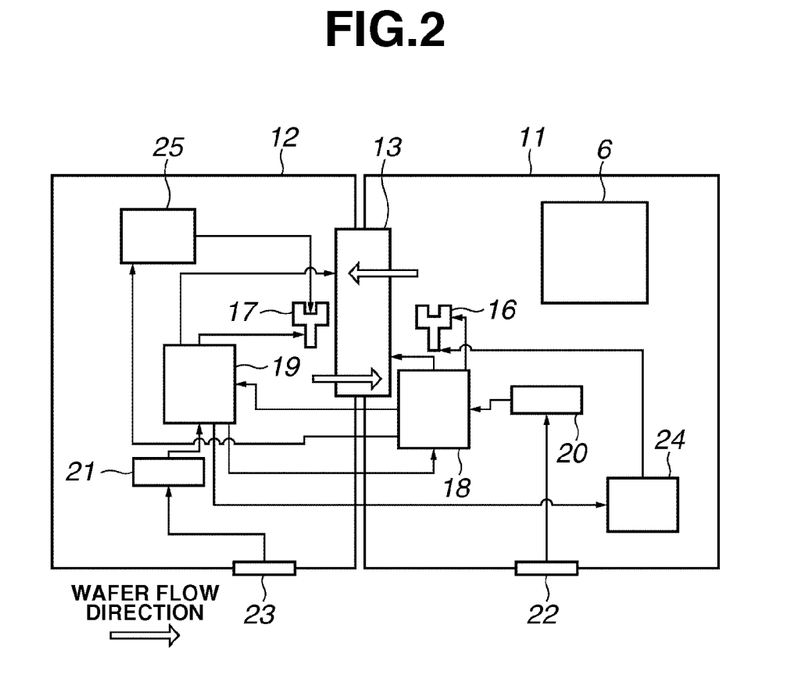
FIG. 2 illustrates a configuration of a semiconductor manufacturing system including an exposure apparatus and a coating and developing apparatus illustrated in FIG. 1 according to a first and a second exemplary embodiments of the present invention, wherein a power source of a robot of the coating and developing apparatus is shut down in response to a signal produced when a chamber door of the exposure apparatus is opened.

As shown in FIG. 2, the semiconductor exposure apparatus is used together with the coating and developing apparatus and provided within an exposure apparatus chamber 11 including a exposure apparatus chamber door 22. The semiconductor exposure apparatus includes an exposure apparatus wafer conveying hand 16, an exposure apparatus control computer 18, an exposure apparatus door open/close detection unit 20 configured to detect whether the exposure apparatus chamber door 22 is open or closed, and a power supply circuit unit 24 for exposure apparatus robot.

The coating and developing apparatus is provided within a coating and developing apparatus chamber 12 including a coating and developing apparatus chamber door 23. The coating and developing apparatus includes a coating and developing apparatus wafer conveying hand 17, a coating and developing apparatus control computer 19, a door open/close detection unit 21 for coating and developing apparatus configured to detect whether the coating and developing apparatus chamber door 23 is open or closed, and a power supply circuit unit 25 for coating and developing apparatus robot.

The exposure apparatus wafer conveying hand 16 receives a wafer conveyed to a wafer transfer station 13 by a wafer conveying hand 17 of the coating and developing apparatus, and conveys the wafer to the XY stage 6. When the exposure processing is finished, the exposure apparatus wafer conveying hand 16 conveys the exposure-processed wafer to the wafer transfer station 13. The exposure apparatus wafer conveying hand 16 may adjust a position of the wafer with a wafer alignment unit (not shown) before the wafer is conveyed to the XY stage 6. The semiconductor exposure apparatus may also have a plurality of exposure apparatus wafer conveying hands.

Figure 3:
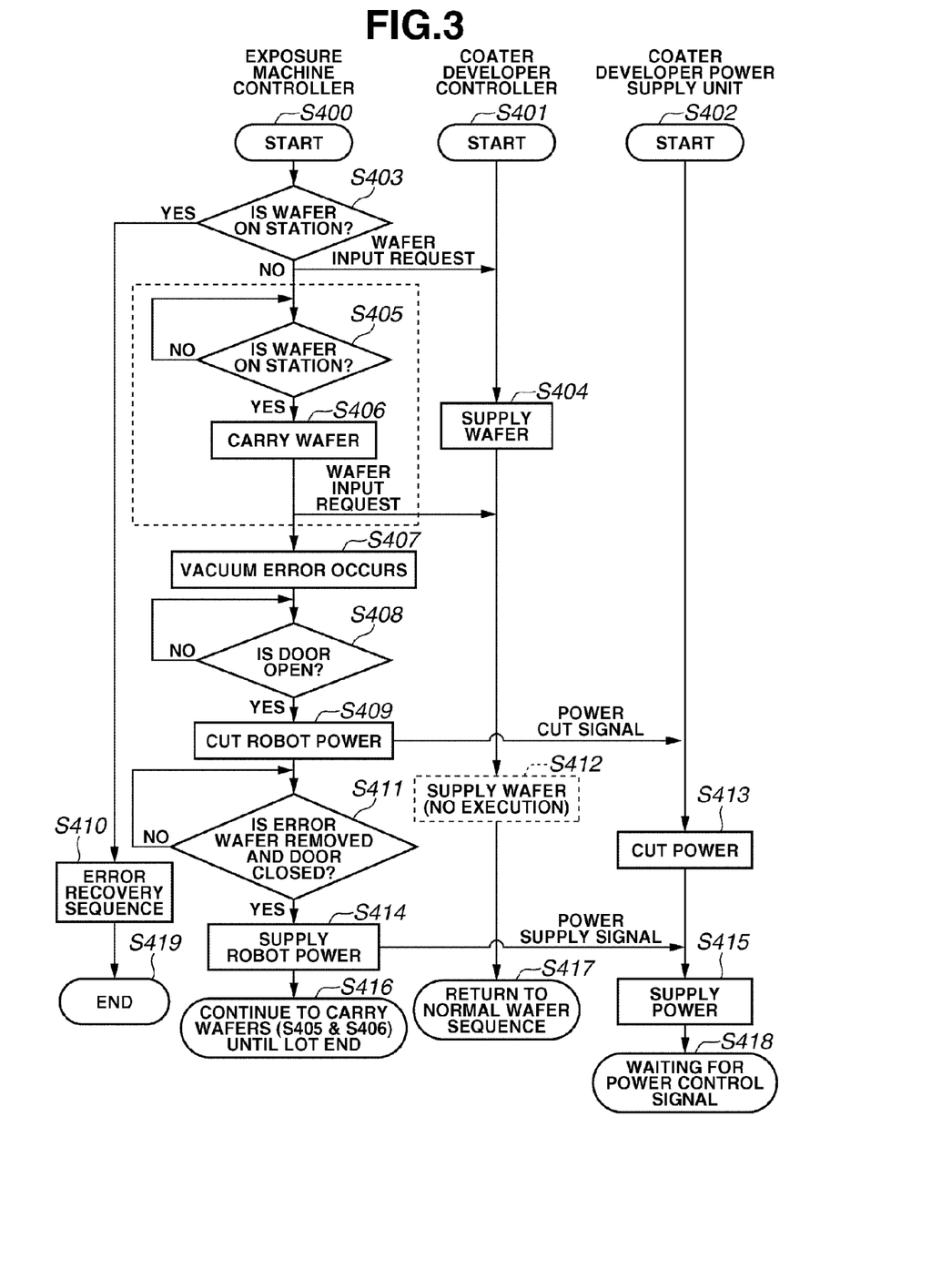
FIG. 3 is a flowchart illustrating a flow of control of the semiconductor manufacturing system illustrated in FIG. 2.

FIG. 3 is a flowchart illustrating a flow of control in a case where the exposure apparatus chamber door 22 is opened for maintenance when a trouble occurs in the exposure apparatus during wafer conveyance processing. In step S400, the exposure apparatus control computer 18 starts controlling the exposure apparatus. In step S401, the coating and developing apparatus control computer 19 starts controlling the coating and developing apparatus. In step S402, the power supply circuit unit 25 for coating and developing apparatus robot is activated. In addition, the equipment arranged in the exposure apparatus chamber 11 and the coating and developing apparatus chamber 12 becomes operable.

In step S403, the exposure apparatus control computer 18 confirms whether a wafer is present on the wafer transfer station 13. If the exposure apparatus control computer 18 confirms that the wafer is present (YES in step S403), then the process proceeds to step S410. If the exposure apparatus control computer 18 confirms that the wafer is not present (NO in step S403), then the exposure apparatus control computer 18 sends a wafer input request to the coating and developing apparatus control computer 19 and proceeds to step S405. In step S410, the exposure apparatus control computer 18 executes wafer presence error recovery processing, and the process ends in step S419.

In step S405, the exposure apparatus control computer 18 confirms whether the wafer is present on the wafer transfer station 13. If the exposure apparatus control computer 18 confirms that the wafer is present (YES in step S405), then the process proceeds to step S406. If the exposure apparatus control computer 18 confirms that the wafer is not present (NO in step S405), then the exposure apparatus control computer 18 repeats the process in step S405.

In step S404, the coating and developing apparatus control computer 19 exercises control over the coating and developing apparatus wafer conveying hand 17 based on the wafer input request received from the exposure apparatus control computer 18. According to the wafer input request, the coating and developing apparatus wafer conveying hand 17 conveys the wafer to the wafer transfer station 13.

In step S406, the exposure apparatus control computer 18 conveys the wafer, which has been conveyed by the coating and developing apparatus wafer conveying hand 17 to the wafer transfer station 13, to the exposure apparatus using the exposure apparatus wafer conveying hand 16. When the exposure apparatus receives the wafer from the wafer transfer station 13, the exposure apparatus control computer 18 transmits the wafer input request to the coating and developing apparatus control computer 19, and the process proceeds to step S407.

In step S407, it is assumed that a vacuum error occurs during the process. This vacuum error is caused by an undesired matter between the wafer and the exposure apparatus wafer conveying hand 16, in the exposure apparatus wafer conveying hand 16 which is conveying the wafer. If this vacuum error is detected, the process proceeds to step S408.

In step S408, the exposure apparatus control computer 18 confirms whether the exposure apparatus chamber door 22 is opened. If the exposure apparatus control computer 18 confirms that the exposure apparatus chamber door 22 is opened (YES in step S408), the process proceeds to step S409. If the exposure apparatus control computer 18 confirms that the exposure apparatus chamber door 22 is closed (NO in step S408), the process in step S408 is repeated. Instead of confirming whether the exposure apparatus chamber door 22 is opened, the exposure apparatus control computer 18 may confirm or detect a signal input by an operator, which is used for unlocking the exposure apparatus chamber door 22 having an electromagnetic locking function. This signal indicates a start of the maintenance work.

Steps S407 and S408 are processes performed after the exposure apparatus control computer 18 sends the wafer input request to the coating and developing apparatus control computer 19. In other words, steps S407 and S408 are processed while the coating and developing apparatus control computer 19 is controlling the coating and developing apparatus wafer conveying hand 17 to convey the wafer to the wafer transfer station 13. Since the exposure apparatus chamber door 22 is open at that time, the wafer transfer station 13 can be accessed so that a person or an object entering from the exposure apparatus chamber door 22 can deal with the coating and developing apparatus wafer conveying hand 17. The person that enters the wafer transfer station 13 is, for example, an operator who performs the maintenance. The object that enters the wafer transfer station 13 is, for example, a tool or a device member inserted into the wafer transfer station 13 by the operator.

In step S409, the exposure apparatus control computer 18 sends a power source turn off signal to the power supply circuit unit 25 for coating and developing apparatus robot.

In step S413, a power source of the power supply circuit unit 25 for coating and developing apparatus robot, which does not have a control computer, is shut down. In step S412, if the coating and developing apparatus wafer conveying hand 17 is in operation, the operation is brought to an emergency stop. The power supply circuit unit 25 for coating and developing apparatus robot maintains the power off state until it receives a power supply signal.

In step S411, the exposure apparatus control computer 18 confirms whether the wafer carried by the exposure apparatus wafer conveying hand 16 is removed and the exposure apparatus chamber door 22 is closed. If the exposure apparatus control computer 18 confirms that the wafer is removed and the exposure apparatus chamber door 22 is closed (YES in step S411), the process proceeds to step S414. If the exposure apparatus control computer 18 is unable to confirm that the wafer is removed and the exposure apparatus chamber door 22 is closed (NO in step S411), then step S411 is repeated.

In step S414, the exposure apparatus control computer 18 sends a power supply signal to the power supply circuit unit 25 for coating and developing apparatus robot.

In step S415, the power of the power supply circuit unit 25 for coating and developing apparatus robot is supplied to the outside and the coating and developing apparatus wafer conveying hand 17 becomes operable in the processing thereafter. In step S417, the coating and developing apparatus wafer conveying hand 17 returns to the normal control state. Further, in step S418, the power supply circuit unit 25 for coating and developing apparatus robot continues to supply power until it receives the power source cut off signal.

In step S416, the exposure apparatus control computer 18 continues to repeat the processing in steps S405 and S406 until the processing reaches the end of the lot (end of a unit of wafer processing) and then the process ends.

According to the present exemplary embodiment, the exposure apparatus control computer 18 directly controls the power supply circuit unit 25 for coating and developing apparatus robot in the coating and developing apparatus chamber 12 when the exposure apparatus chamber door 22 is open. However, the coating and developing apparatus control computer 19 may receive the electric signal directly from the exposure apparatus door open/close detection unit 20 or through the exposure apparatus control computer 18 to control (i.e., cut) the power of the power supply circuit unit 25 for coating and developing apparatus robot based on the electric signal. In either case, the power off instruction from the exposure apparatus control computer 18 to the power supply circuit unit 25 for coating and developing apparatus robot may be sent through a dedicated line. However, if the coating and developing apparatus control computer 19 receives the electric signal directly from the exposure apparatus door open/close detection unit 20, a dedicated signal cable is desirably used for exchanging member transfer information between the apparatuses by a method called Parallel Input/Output (PIO). If the coating and developing apparatus control computer 19 receives the electric signal from the exposure apparatus door open/close detection unit 20 through the exposure apparatus control computer 18, a dedicated serial communication line is desirably used for exchanging apparatus information with another apparatus or with a dedicated computer for performing overall control of the apparatus by a method called Linked Litho.

According to the present exemplary embodiment, the exposure apparatus control computer 18 directly controls the power supply circuit unit 25 for coating and developing apparatus robot in the coating and developing apparatus chamber 12 when the exposure apparatus chamber door 22 is open. However, instead of cutting power of the power supply circuit unit 25 for coating and developing apparatus robot, the operation of the coating and developing apparatus wafer conveying hand 17 may be stopped or inhibited. Also, in this case, it is effective to use the above-described signal cable or serial communication line in transmitting the electric signal of the exposure apparatus door open/close detection unit 20 from the exposure apparatus to the coating and developing apparatus.

Second Exemplary Embodiment

In the first exemplary embodiment, a flowchart is described which illustrates a flow of control in a case where the exposure apparatus chamber door 22 is opened for maintenance of the semiconductor exposure apparatus when a trouble occurs in the exposure apparatus. In that case, wafer conveyance processing is being controlled in the exposure apparatus. A flowchart of a case where the coating and developing apparatus chamber door 23 is opened for maintenance of the coating and developing apparatus when a trouble occurs in the coating and developing apparatus is similar to the flowchart described in the first exemplary embodiment if each member in the exposure apparatus is replaced with a corresponding member in the coating exposing apparatus. In other words, the present invention can be achieved by replacing the exposure apparatus chamber 11 with the coating and developing apparatus chamber 12, the coating and developing apparatus wafer conveying hand 17 with the exposure apparatus wafer conveying hand 16, the exposure apparatus control computer 18 with the coating and developing apparatus control computer 19, the exposure apparatus door open/close detection unit 20 with the door open/close detection unit 21 for coating and developing apparatus, the exposure apparatus chamber door 22 with the coating and developing apparatus chamber door 23, and the power supply circuit unit 25 for coating and developing apparatus robot with the power supply circuit unit 24 exposure apparatus robot in the description of the first exemplary embodiment, respectively.

Third Exemplary Embodiment

Figure 4:
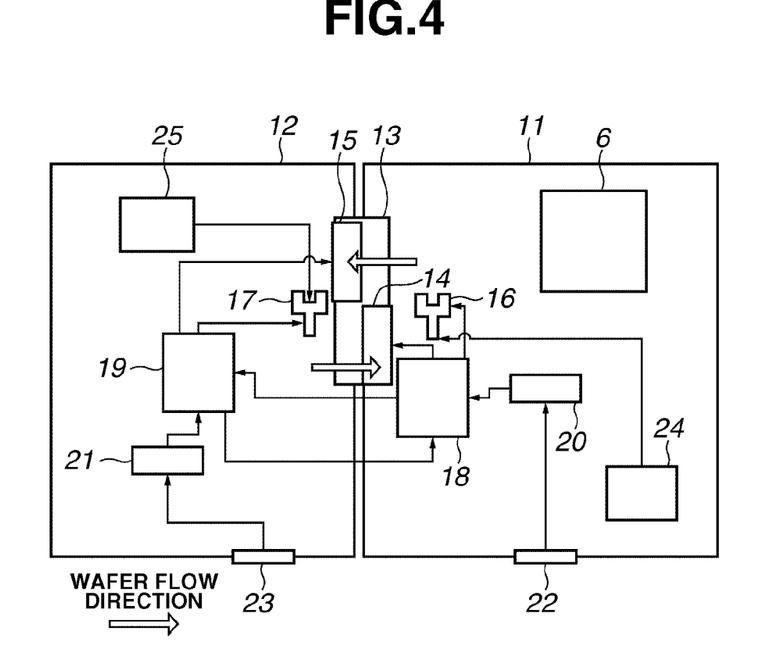
FIG. 4 illustrates a configuration of a semiconductor manufacturing system including the exposure apparatus and the coating and developing apparatus illustrated in FIG. 1 according to a third and a fourth exemplary embodiments of the present invention, wherein a protective shutter of the exposure apparatus is closed in response to a signal produced when a chamber door of the exposure apparatus is opened.

A semiconductor manufacturing system shown in FIG. 4 has an exposure apparatus protective shutter 14 and a coating and developing apparatus shutter 15 in addition to the semiconductor manufacturing system shown in FIG. 2. The exposure apparatus control computer 18 and the power supply circuit unit 25 for coating and developing apparatus robot in the semiconductor manufacturing system which are directly connected in FIG. 2, are not connected in the semiconductor manufacturing system shown in FIG. 4. Further, the coating and developing apparatus control computer 19 is not directly connected to the power supply circuit unit 24 for exposure apparatus robot.

Figure 5:
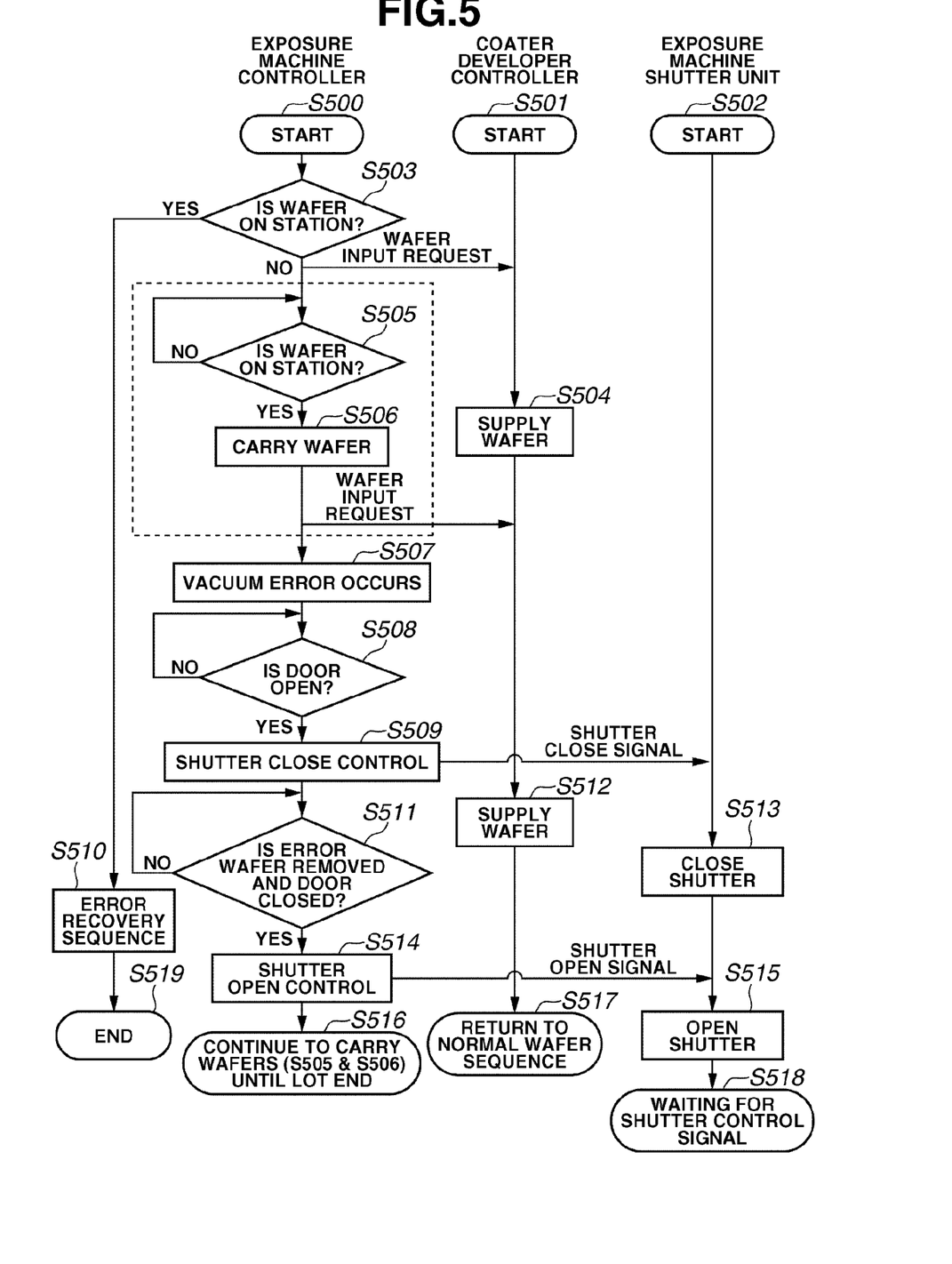
FIG. 5 is a flowchart illustrating a control of the semiconductor manufacturing system illustrated in FIG. 4.

FIG. 5 is a flowchart illustrating control of the semiconductor manufacturing system illustrated in FIG. 4.

In step S500, the exposure apparatus control computer 18 starts controlling the exposure apparatus. In step S501, the coating and developing apparatus control computer 19 starts controlling the coating and developing apparatus. In step S502, the exposure apparatus protective shutter 14 becomes operable. In addition, equipment arranged in the exposure apparatus chamber 11 and the coating and developing apparatus chamber 12 become operable.

In step S503, the exposure apparatus control computer 18 confirms whether a wafer is present on the wafer transfer station 13. If the exposure apparatus control computer 18 confirms that the wafer is present (YES in step S503), then the process proceeds to step S510. If the exposure apparatus control computer 18 confirms that the wafer is not present (NO in step S503), then the exposure apparatus control computer 18 sends a wafer input request to the coating and developing apparatus control computer 19 and proceeds to step S505.

In step S510, the exposure apparatus control computer 18 executes wafer presence error recovery processing, and the process ends in step S519.

In step S505, the exposure apparatus control computer 18 confirms whether the wafer is present on the wafer transfer station 13. If the exposure apparatus control computer 18 confirms that the wafer is present (YES in step S505), then the process proceeds to step S506. If the exposure apparatus control computer 18 confirms that the wafer is not present (NO in step S505), then the exposure apparatus control computer 18 repeats the process in step S505.

In step S504, the coating and developing apparatus control computer 19 controls the coating and developing apparatus wafer conveying hand 17 based on the wafer input request received from the exposure apparatus control computer 18. According to the wafer input request, the coating and developing apparatus wafer conveying hand 17 conveys the wafer to the wafer transfer station 13.

In step S506, the exposure apparatus control computer 18 conveys the wafer, which has been conveyed by the coating and developing apparatus wafer conveying hand 17 to the wafer transfer station 13, to the exposure apparatus using the exposure apparatus wafer conveying hand 16. When the exposure apparatus receives the wafer from the wafer transfer station 13, the exposure apparatus control computer 18 transmits the wafer input request to the coating and developing apparatus control computer 19, and the process proceeds to step S507.

In step S507, it is assumed that a vacuum error occurs during the process. This vacuum error is caused by an undesired matter between the wafer and the exposure apparatus wafer conveying hand 16, in the exposure apparatus wafer conveying hand 16 which is conveying the wafer. If this vacuum error is detected, the process proceeds to step S508.

In step S508, the exposure apparatus control computer 18 confirms whether the exposure apparatus chamber door 22 is opened. If the exposure apparatus control computer 18 confirms that the exposure apparatus chamber door 22 is opened (YES in step S508), the process proceeds to step S509. If the exposure apparatus control computer 18 confirms that the exposure apparatus chamber door 22 is closed (NO in step S508), the process in step S508 is repeated.

Steps S507 and S508 are processes after the wafer input request is sent to the coating and developing apparatus control computer 19 by the exposure apparatus control computer 18. In other words, steps S507 and S508 are processed while the coating and developing apparatus control computer 19 is controlling the coating and developing apparatus wafer conveying hand 17 to convey the wafer to the wafer transfer station 13. Since the exposure apparatus chamber door 22 is open at that time, the wafer transfer station 13 can be accessed so that a person or an object entering from the exposure apparatus chamber door 22 can deal with the coating and developing apparatus wafer conveying hand 17. The person that enters the wafer transfer station 13 is, for example, an operator who performs the maintenance. The object that enters the wafer transfer station 13 is, for example, a tool or a device member inserted into the wafer transfer station 13 by the operator.

In step S509, the exposure apparatus control computer 18 sends a shutter close signal to the exposure apparatus protective shutter 14 which is provided on the wafer receiving side of the wafer transfer station 13.

In step S513, the exposure apparatus protective shutter 14 is closed by the exposure apparatus control computer 18. The exposure apparatus protective shutter 14 is closed until it receives a shutter open signal. Since the exposure apparatus protective shutter 14 is closed, the exposure apparatus maintenance operation can be safely performed.

In step S512, the coating and developing apparatus control computer 19 controls the coating and developing apparatus wafer conveying hand 17 while the exposure apparatus protective shutter 14 is closed and conveys the wafer to the wafer transfer station 13. Next, the process returns to the normal wafer sequence S517.

In step S511, the exposure apparatus control computer 18 confirms whether the wafer carried by the exposure apparatus wafer conveying hand 16 is removed and the exposure apparatus chamber door 22 is closed. If the exposure apparatus control computer 18 confirms that the wafer is removed and the exposure apparatus chamber door 22 is closed (YES in step S511), the process proceeds to step S514. If the exposure apparatus control computer 18 is unable to confirm that the wafer is removed and the exposure apparatus chamber door 22 is closed (NO in step S511), then step S511 is repeated.

In step S514, the exposure apparatus control computer 18 sends a shutter open signal to the exposure apparatus protective shutter 14.

In step S515, the exposure apparatus protective shutter 14 which is provided on the wafer receiving side of the wafer transfer station 13 is opened. The exposure apparatus protective shutter 14 is opened until it receives a shutter close signal in step S518. Since the exposure apparatus protective shutter 14 is opened, the exposure apparatus wafer conveying hand 16 is able to access the wafer transfer station 13 again.

In step S516, the exposure apparatus control computer 18 continues to repeat the processing in steps S505 and S506 until the processing reaches the end of the lot (end of a unit of wafer processing) and then the process ends.

Fourth Exemplary Embodiment

In the third exemplary embodiment, a flowchart is described which illustrates a flow of control in a case where the exposure apparatus chamber door 22 is opened for maintenance of the semiconductor exposure apparatus when a trouble occurs in the exposure apparatus. In that case, wafer conveyance processing is being controlled in the exposure apparatus. A flowchart of a case where the coating and developing apparatus chamber door 23 is open for maintenance of the coating and developing apparatus when a trouble occurs in the coating and developing apparatus is similar to the flowchart described in the third exemplary embodiment if each member in the exposure apparatus is replaced with a corresponding member in the coating exposing apparatus. In other words, the present invention can be achieved by replacing the exposure apparatus chamber 11 with the coating and developing apparatus chamber 12, the exposure apparatus protective shutter 14 with the coating and developing apparatus shutter 15, the coating and developing apparatus wafer conveying hand 17 with the exposure apparatus wafer conveying hand 16, the exposure apparatus control computer 18 with the coating and developing apparatus control computer 19, the exposure apparatus door open/close detection unit 20 with the door open/close detection unit 21 for coating and developing apparatus, and the exposure apparatus chamber door 22 with the coating and developing apparatus chamber door 23, respectively.

According to the first and the second exemplary embodiments, when the door of the apparatus which is to be maintained, is opened, the electric signal is changed. The electric signal is then sent to the other apparatus. According to this signal, the drive power of the wafer input robot is turned off and the member input robot is brought to an emergency stop. The electric signal is detected and the power supply circuit is directly cut off without using a control computer. Thus, the apparatuses are free from software problem or hang-up of the control computer. Accordingly, safety in the access area of the wafer input robot can be secured at a lower cost with certainty.

Further, another method can provide a similar effect. In that method, an electric signal that changes at the time the door of the apparatus to be maintained is opened, is sent to a control computer of another apparatus. The drive control of the wafer input robot is stopped by a determination of the control computer according to the electric signal. In this manner, a similar effect can be achieved although reliability may be somewhat degraded.

According to the third and the fourth exemplary embodiments, in response to the electric signal that changes when the door of the apparatus to be maintained is opened, a protective safety shutter can be provided at an area where the apparatus to be maintained is accessed by a member conveyance robot of another apparatus. By closing this protective safety shutter, access to the member conveyance robot access area from the apparatus which performs maintenance can be can be excluded. Since this method eliminates a need for communicating a signal between two apparatuses, safety in the access area of the wafer input robot can be enhanced. This method, however, requires a space for the protective safety shutter in the apparatus and the apparatus cost rises as a result.

Fifth Exemplary Embodiment

FIG. 9 is a flowchart illustrating exemplary manufacturing processes for a micro device (a semiconductor chip such as an integrated circuit (IC) or a large scale integration (LSI), a liquid crystal panel, a charge-coupled device (CCD), a thin film magnetic head, a micro machine, etc.) using the aforementioned semiconductor manufacturing apparatus system.

Figure 6:
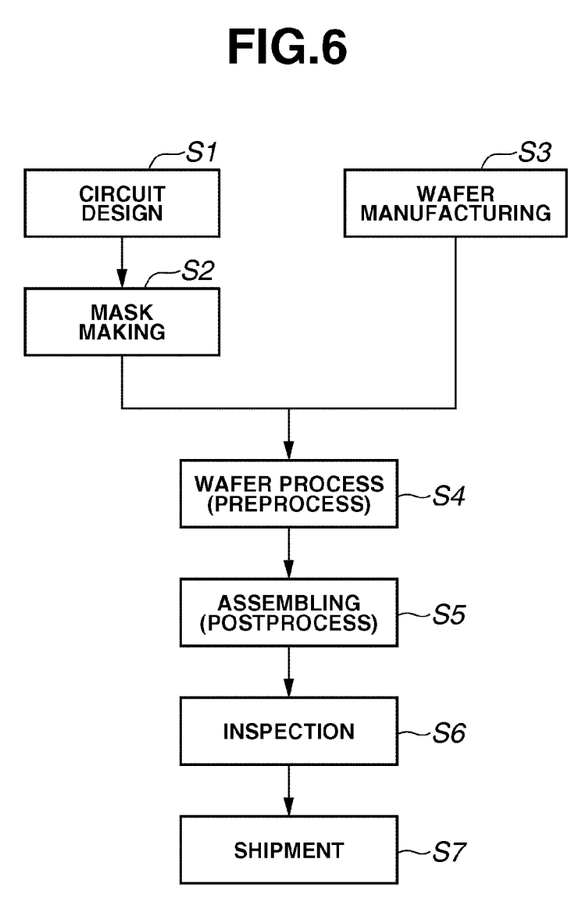
FIG. 6 is a flowchart illustrating exemplary manufacturing process of a semiconductor device.

FIG. 6 is a flowchart illustrating exemplary manufacturing processes for a semiconductor device.

Step S1 is a circuit design process for designing a circuit of a semiconductor device. Step S2 is a mask making process for fabricating a mask, which can be referred to as an original plate or a reticle, based on a designed circuit pattern.

Step S3 is a wafer manufacturing process for manufacturing a wafer, which can be referred to as a substrate, out of a silicon or comparable material. Step S4 is a wafer process, which can be referred to as "preprocess", for forming an actual circuit on a wafer using an exposure apparatus with the above-described prepared mask according to the lithography technique.

Step S5 is an assembling process, which can be referred to as "postprocess", for forming a semiconductor chip using the wafer manufactured in step S4. The postprocess includes an assembly process (e.g., dicing, bonding, etc.) and a packaging process (chip sealing). Step S6 is an inspection process for inspecting the semiconductor device manufactured in step S5. The inspection includes an operation confirmation test and an endurance test. Step S7 is a shipment process for shipping the semiconductor device completed through the above-described processes.

The above-described wafer process in step S4 includes an oxidation step for oxidizing a wafer surface, a chemical vapor deposition (CVD) step for forming an insulating film on the wafer surface, and an electrode formation step for forming electrodes on the wafer by vaporization. Furthermore, the wafer process in step S4 includes an ion implantation step for implanting ions into the wafer, a resist processing step for coating the wafer with a photosensitive material using the above-described coating and developing apparatus, and an exposure step for exposing the wafer subjected to the resist processing step to light by the above-described exposure apparatus using a mask having a circuit pattern. Furthermore, the wafer process in step S4 includes a developing step for developing the wafer exposed in the exposure step, an etching step for cutting a portion other than a resist image developed in the developing step, and a resist stripping step for removing an unnecessary resist remaining after the etching step. By repeating of the processing in the above-described steps, multiple circuit patterns can be formed on a wafer.

According to the aforementioned exemplary embodiments, for example, safety of the processing apparatus can be increased.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2007-027469 filed Feb. 7, 2007, which is hereby incorporated by reference herein in its entirety.

What is claimed is:

1. A processing apparatus including a processing unit configured to process an object, the processing apparatus comprising:
    a first conveying unit configured to convey the object between a transfer portion provided between an external apparatus and the processing unit, and the processing unit;
    a first controller configured to output a request signal requesting the external apparatus to convey the object to the transfer portion; and
    an output unit configured to output a signal indicating a start of maintenance of the processing apparatus,
    wherein the external apparatus includes a second conveying unit configured to convey the object to the transfer portion, a second controller configured to control the second conveying unit, and a power supply unit configured to supply power to the second conveying unit, and
    wherein the first controller is configured to output, to the power supply unit, a signal for cutting off power supply from the power supply unit to the second conveying unit, without intervention of the second controller, based on the signal indicating the start of maintenance output from the output unit, after outputting the request signal.

2. The processing apparatus according to claim 1, further comprising a door for the maintenance, wherein the output unit includes a detection unit configured to detect an open state of the door.

3. The processing apparatus according to claim 1, further comprising
    a shutter configured to isolate, in the transfer portion, an approach area of the second conveying unit,
    wherein the first controller is configured to close the shutter based on the signal indicating the start of maintenance output from the output unit, after outputting the request signal.

4. The processing apparatus according to claim 3, further comprising a door for the maintenance, wherein the output unit includes a detection unit configured to detect an open state of the door.

5. The processing apparatus according to claim 1, wherein the processing apparatus is a device manufacturing apparatus.

6. The processing apparatus according to claim 5, wherein the processing apparatus is an exposure apparatus, and the external apparatus is a photosensitive material coating and developing apparatus.

7. The processing apparatus according to claim 5, wherein the processing apparatus is a photosensitive material coating and developing apparatus, and the external apparatus is an exposure apparatus.

8. A method of manufacturing a device, the method comprising:
    exposing a substrate to radiant energy using a processing apparatus;
    developing the exposed substrate; and
    processing the developed substrate to manufacture the device,
    wherein the processing apparatus includes a processing unit configured to process an object, the processing apparatus including:
    a first conveying unit configured to convey the object between a transfer portion provided between an external apparatus and the processing unit, and the processing unit,
    a first controller configured to output a request signal requesting the external apparatus to convey the object to the transfer portion, and
    an output unit configured to output a signal indicating a start of maintenance of the processing apparatus,
    wherein the external apparatus includes a second conveying unit configured to convey the object to the transfer portion, a second controller configured to control the second conveying unit, and a power supply unit configured to supply power to the second conveying unit,
    wherein the first controller is configured to output, to the power supply unit, a signal for cutting off power supply from the power supply unit to the second conveying unit, without intervention of the second controller, based on the signal indicating the start of maintenance output from the output unit, after outputting the request signal, and
    wherein the processing apparatus is an exposure apparatus, and the external apparatus is a photosensitive material coating and developing apparatus.

9. A method of manufacturing a device, the method comprising:
    exposing a substrate to radiant energy;
    developing the exposed substrate using a processing apparatus; and
    processing the developed substrate to manufacture the device,
    wherein the processing apparatus includes a processing unit configured to process an object, the processing apparatus including:
    a first conveying unit configured to convey the object between a transfer portion provided between an external apparatus and the processing unit, and the processing unit,
    a first controller configured to output a request signal requesting the external apparatus to convey the object to the transfer portion, and
    an output unit configured to output a signal indicating a start of maintenance of the processing apparatus,
    wherein the external apparatus includes a second conveying unit configured to convey the object to the transfer portion, a second controller configured to control the second conveying unit, and a power supply unit configured to supply power to the second conveying unit, wherein the first controller is configured to output, to the power supply unit, a signal for cutting off power supply from the power supply unit to the second conveying unit, without intervention of the second controller, based on the signal indicating the start of maintenance output from the output unit, after outputting the request signal, and wherein the processing apparatus is a photosensitive material coating and developing apparatus, and the external apparatus is an exposure apparatus.

10. A method of manufacturing a device, the method comprising:

coating a substrate with photosensitive material using a processing apparatus;

exposing the coated substrate to radiant energy; and processing the exposed substrate to manufacture the device, wherein the processing apparatus includes a processing unit configured to process an object, the processing apparatus including:

a first conveying unit configured to convey the object between a transfer portion provided between an external apparatus and the processing unit, and the processing unit, a first controller configured to output a request signal requesting the external apparatus to convey the object to the transfer portion, and an output unit configured to output a signal indicating a start of maintenance of the processing apparatus, wherein the external apparatus includes a second conveying unit configured to convey the object to the transfer portion, a second controller configured to control the second conveying unit, and a power supply unit configured to supply power to the second conveying unit, wherein the first controller is configured to output, to the power supply unit, a signal for cutting off power supply from the power supply unit to the second conveying unit, without intervention of the second controller, based on the signal indicating the start of maintenance output from the output unit, after outputting the request signal, and wherein the processing apparatus is a photosensitive material coating and developing apparatus, and the external apparatus is an exposure apparatus.

* * * * *